(12) United States Patent
Tseng et al.

(10) Patent No.: US 10,588,214 B2
(45) Date of Patent: Mar. 10, 2020

(54) STACKED STRUCTURE AND METHOD FOR MANUFACTURING THE SAME

(71) Applicant: Unimicron Technology Corp., Taoyuan (TW)

(72) Inventors: Tzyy-Jang Tseng, Hsinchu (TW); Kai-Ming Yang, Hsinchu County (TW); Pu-Ju Lin, Hsinchu (TW); Cheng-Ta Ko, Taipei (TW); Yu-Hua Chen, Hsinchu (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/543,609

(22) Filed: Aug. 18, 2019

(65) Prior Publication Data

US 2019/0373713 A1 Dec. 5, 2019

Related U.S. Application Data

(60) Continuation-in-part of application No. 16/203,636, filed on Nov. 29, 2018, which is a division of
(Continued)

(30) Foreign Application Priority Data

Jun. 25, 2019 (TW) .............................. 108122210 A

(51) Int. Cl.
*H05K 1/02* (2006.01)
*H05K 1/11* (2006.01)

(52) U.S. Cl.
CPC ........... *H05K 1/0209* (2013.01); *H05K 1/114* (2013.01); *H05K 2201/0116* (2013.01); *H05K 2201/0195* (2013.01); *H05K 2201/041* (2013.01)

(58) Field of Classification Search
CPC ................ H05K 1/0209; H05K 1/114; H05K 2201/041; H05K 2201/0116; H05K 2201/0195
(Continued)

(56) References Cited

U.S. PATENT DOCUMENTS 5,801,446 A * 9/1998 DiStefano ........... H01L 23/3157
257/738
5,838,069 A * 11/1998 Itai ...................... H01L 21/4853
257/766

(Continued)

FOREIGN PATENT DOCUMENTS

| CN | 101049056 B | 6/2011 |
|---|---|---|
| TW | 545098 B | 8/2003 |
| TW | I505382 B | 10/2015 |

*Primary Examiner* — Sherman Ng
(74) *Attorney, Agent, or Firm* — CKC & Partners Co., LLC

(57) ABSTRACT

A stacked structure includes a circuit board, an electronic component, metallic cores, and insulating cladding layers. The circuit board includes first bonding pads. The electronic component includes second bonding pads that are opposite to the first bonding pads. Each metallic core is connected to a corresponding first bonding pad and a corresponding second bonding pad. The metallic cores have a curved surface interposed between the corresponding first bonding pad and the corresponding second bonding pad. The insulating cladding layers are separated from each other and cover the curved surfaces of the metallic cores.

12 Claims, 14 Drawing Sheets

Related U.S. Application Data application No. 15/590,020, filed on May 9, 2017, now Pat. No. 10,178,755.

(58) Field of Classification Search
USPC .................. 361/736; 174/257, 258, 260
See application file for complete search history.

(56) References Cited

U.S. PATENT DOCUMENTS

| | | | |
|---|---|---|---|
| 6,283,359 B1* | 9/2001 | Brofman | B23K 35/0222 |
| | | | 228/180.21 |
| 6,740,985 B1 | 5/2004 | Zhao | |
| 9,780,056 B1* | 10/2017 | Lu | H01L 24/11 |
| 2010/0025097 A1* | 2/2010 | Kojima | C09J 9/02 |
| | | | 174/261 |
| 2015/0325543 A1* | 11/2015 | Katkar | H01L 24/14 |
| | | | 257/738 |
| 2016/0111385 A1 | 4/2016 | Yu et al. | |
| 2016/0190054 A1* | 6/2016 | Park | H01L 23/4828 |
| | | | 257/692 |

* cited by examiner

STACKED STRUCTURE AND METHOD FOR MANUFACTURING THE SAME

CROSS-REFERENCE TO RELATED APPLICATION

This application is a Continuation-in-part of U.S. application Ser. No. 16/203,636, filed on Nov. 29, 2018, which is a Divisional application of U.S. application Ser. No. 15/590,020, filed on May 9, 2017, the entireties of which are incorporated by reference herein. This application further claims priority to Taiwan Application Serial Number 108122210, filed Jun. 25, 2019, which is herein incorporated by reference in its entirety.

BACKGROUND

The present invention relates to a stacked structure and a method for manufacturing the same. More particularly, the present invention relates to a stacked structure with a circuit board and a method for manufacturing the same.

DESCRIPTION OF RELATED ART

As the integrated circuit chip and the various electronic products continue developing to the smaller size, the electrical connections between different electronic components in the electronic products therefore develop to the smaller dimensions. The connection pads with microscale or nanoscale widely use in components of various electronic products. Because the bonding quality directly affects the performance, quality and reliability, the bonding between microscale bonding pads or between nanoscale bonding pads becomes very important. When the scale of bonding is reduced, the process yield is also easy to receive the interference from different kinds of external factors. For example, if copper-to-copper is used to bond components of fine pitch, it may face a problem about oxidation of copper surface before bonding such that the remaining space is existed between the connection points after bonding, which affects the reliability of the assembly of components with fine spacing after bonding.

In view of above therein, there is an urgent need for a better method of assembling of component of fine pitch to solve the above problems.

SUMMARY

The invention provides a stacked structure and a method for manufacturing the same to solve the foregoing problems.

According to one aspect of the present invention is provided a stacked structure. The stacked structure includes a first circuit board, an electronic component, metallic cores, and insulating cladding layers. The circuit board includes first bonding pads. The electronic component includes second bonding pads opposite to the first bonding pads. Each metallic core is physically connected to a corresponding one of the first bonding pads and a corresponding one of the second bonding pads. Each metallic core has a curved surface sandwiched between the corresponding first bonding pad and the corresponding second bonding pad. The insulating cladding layers are separated from each other and covering the curved surfaces of the metallic cores.

In some embodiment, the insulating cladding layers include an insulating polymer material or an insulating nano bonding material.

In some embodiment, the first circuit board further includes a first circuit layer, a first dielectric layer disposed on the first circuit layer, and a first patterned seed layer. The first dielectric layer has a plurality of first openings exposing a portion of the first circuit layer. The first patterned seed layer is disposed on a surface of the first circuit layer exposed through the first openings and sidewalls of the first openings of the first dielectric layer.

In some embodiment, the first patterned seed layer and the first bonding pads partially fill the first openings such that each first opening exists a remaining space. Each metallic core fully fills each remaining space.

In some embodiment, each first bonding pad includes a first portion located in each first opening and a second portion extended from the first portion to a position above the first dielectric layer.

In some embodiment, the second portions of the first bonding pads are covered by the insulating cladding layers.

In some embodiment, the electronic component further includes a second dielectric layer having a plurality of second openings. Each second bonding pad includes a first portion located in each second opening and a second portion extending from the first portion to a position above the second dielectric layer.

In some embodiment, the second portions of the second bonding pads are covered by the insulating cladding layers.

In some embodiment, each curved surface continuously extends from each second portion of each first bonding pad to each second portion of each second bonding pad.

In some embodiment, the first bonding pads are made of porous copper.

According to another aspect of the present invention is provided a method for manufacturing a stacked structure. The method includes the following steps: (i) providing a first circuit board including a plurality of first bonding pads; (ii) disposing a core-shell particle on each first bonding pad, wherein each core-shell particle includes a metallic core and an insulating protective layer covering the metallic core; and (iii) bonding a plurality of second bonding pads of an electronic component to the core-shell particles on the first bonding pads using a thermo-compression process such that the metallic cores are physically connected to the second bonding pads and the first bonding pads.

In some embodiment, the step of bonding the second bonding pads of the electronic component to the core-shell particles of the first bonding pads using the thermo-compression process includes flowing the insulating protective layers to cover the first bonding pads.

In some embodiment, the first bonding pads are made of porous copper.

Based on the above, the electrical connection structure is formed by use of the metallic cores to bond the circuit board with the electronic component using a thermo-compression in the embodiments of the present disclosure. Specifically, because surfaces of the metallic cores are covered by the insulating cladding layers, surfaces of the metallic cores will not cause the problem about oxidation while bonding, and the remaining space between upper connection point and lower connection point (for example, the first bonding pads and the second bonding pads) is filled with each metallic core effectively. In addition, when bonding using the thermo-compression, the insulating cladding layers may laterally flow to cover outer side surface of the electrical connection structure to achieve the function of protecting connection point and improve reliability of component assembly.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
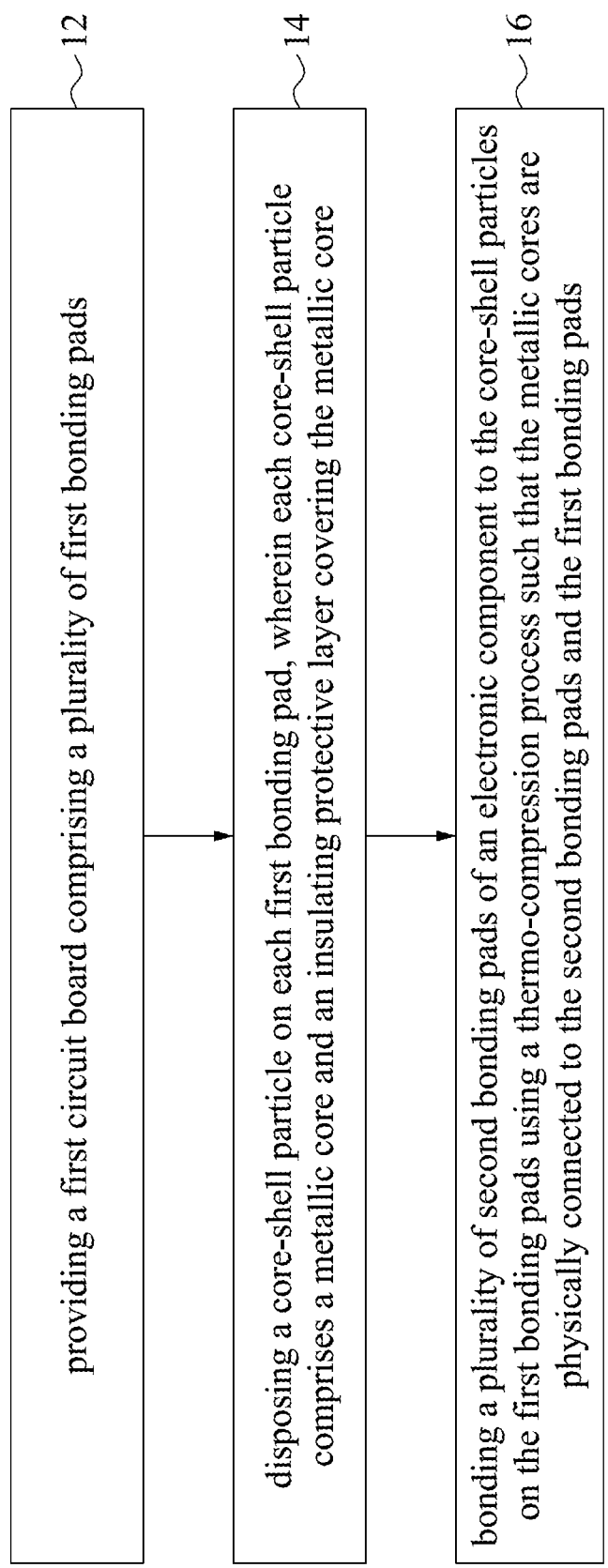
FIG. 1 is a flow diagram illustrating a method of manufacturing a stacked structure in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is also emphasized that the drawings appended illustrate only typical embodiments of this invention and are therefore not to be considered limiting in scope, for the invention may apply equally well to other embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
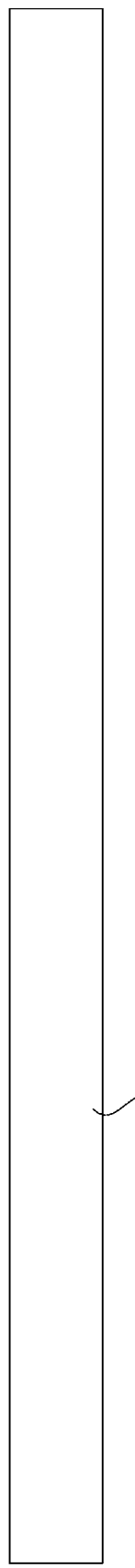
FIG. 2 to FIG. 13 illustrate cross-sectional views of a method of manufacturing stacked structure at different fabrication stages in accordance with some embodiments of the present disclosure.

One aspect of the present invention is provided a manufacturing method of a stacked structure 300. FIG. 1 is a flow diagram illustrating a method 10 of manufacturing a stacked structure in accordance with various embodiments of the present disclosure. The method 10 includes operation 12, operation 14, and operation 16. At operation 12, a first circuit board having a plurality of first bonding pads is provided. FIG. 2 to FIG. 13 illustrate cross-sectional views of implementing operation 12 at different fabrication stages in accordance with some embodiments of the present disclosure. First of all, a carrier 101 is provided, as shown in FIG. 2.

Figure 3:
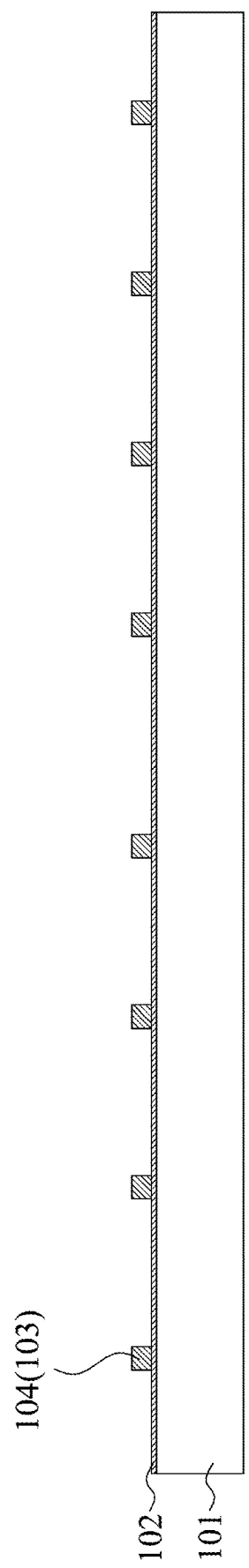

As shown in FIG. 3, a metal bonding layer 102 is formed on the carrier 101. Then, a pad layer 103 is formed on the metal bonding layer 102. Finally, a plurality of pads 104 are formed by patterning the pad layer 103. Specifically, the metal bonding layer 102 may be made of titanium, and the pad layer 103 may be made of copper. The metal bonding layer 102 and the pad layer 103 may be formed by sputtering.

Figure 4:
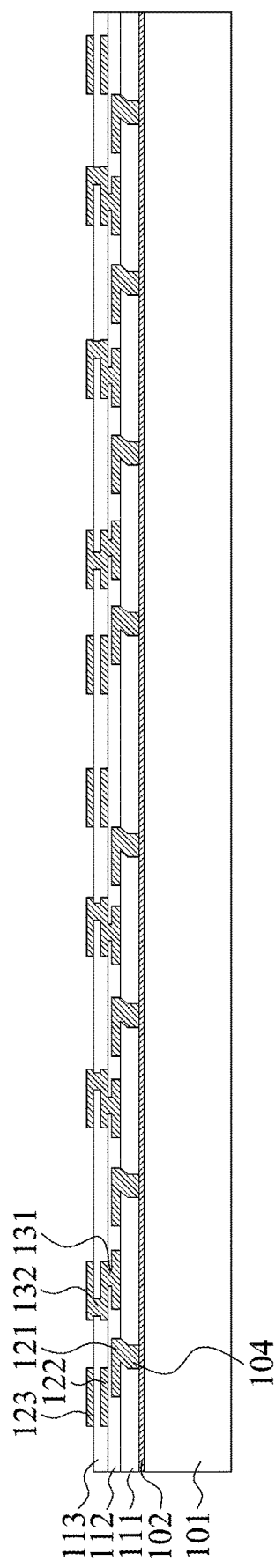

As shown in FIG. 4, the dielectric layers 111, 112, and 113, the circuit layer 121, 122, and 123, a plurality of conductive vias 131, and a plurality of conductive vias 132 are respectively formed. The dielectric layer 111 is disposed on the metal bonding layer 102. The pad 104 is disposed in the dielectric layer 111. The circuit layer 121 is disposed on the dielectric layer 111 and in the dielectric layer 112, and the circuit layer 121 is connected to the pad 104. The dielectric layer 112 is disposed on the dielectric layer 111 and the circuit layer 121. The circuit layer 122 is disposed on the dielectric layer 112 and in the dielectric layer 113. The conductive vias 131 are disposed in the dielectric layer 112 and connect the circuit layer 121 to the circuit layer 122. The dielectric layer 113 is disposed on the dielectric layer 112 and the circuit layer 122. The circuit layer 123 is disposed on the dielectric layer 113. The conductive vias 132 are disposed in the dielectric layer 113 and connect the circuit layer 122 to the circuit layer 123. Specifically, the circuit layers 121, 122, and 123 and the conductive vias 131 and 132 may be made of copper.

Figure 5:
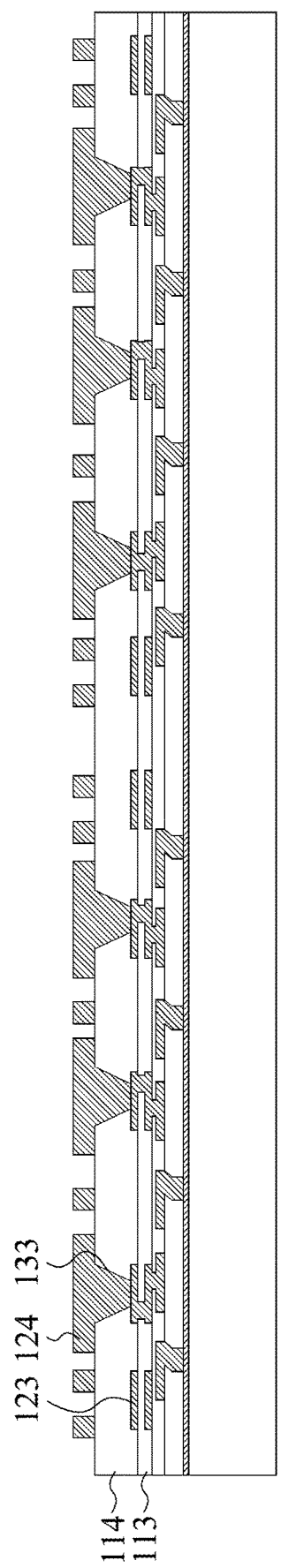

As shown in FIG. 5, a dielectric layer 114, a first circuit layer 124, and a plurality of conductive vias 133 are respectively formed. The dielectric layer 114 is disposed on the dielectric layer 113 and the circuit layer 123. The first circuit layer 124 is disposed on the dielectric layer 114. The conductive vias 133 are disposed in the dielectric layer 114 and connect the circuit layer 123 to the first circuit layer 124. Specifically, the first circuit layer 124 and the conductive vias 133 may be made of copper. The first circuit layer 124 is a conductive path having a specific pattern.

Figure 6:
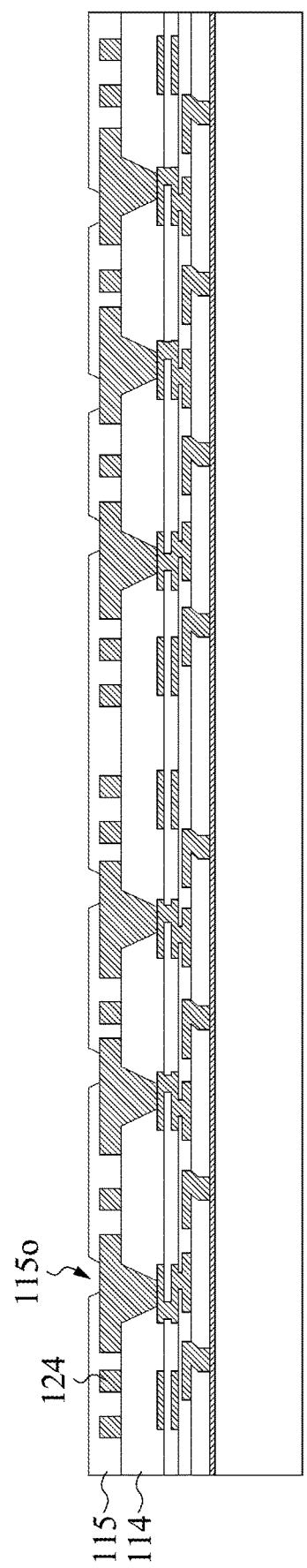

As shown in FIG. 6, a first dielectric layer 115 is formed on the dielectric layer 114 and the first circuit layer 124. Then, a plurality of first openings 115o are formed in the first dielectric layer 115 to expose a part of the first circuit layer 124. The first openings 115o may be formed by laser ablation. The sidewalls of the first openings 115o are tilted.

Figure 7:
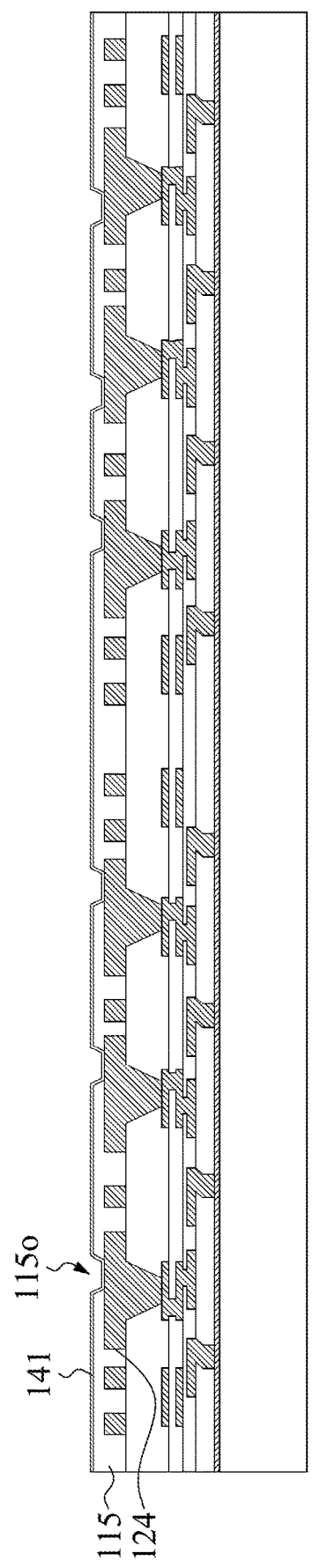

As shown in FIG. 7, a seed layer 141 is formed on the exposed parts of the first circuit layer 124, sidewalls of the first openings 115o, and top surface of the first dielectric layer 115 (i.e., the exposed parts of the first circuit layer 124 and the first dielectric layer 115). Specifically, the seed layer 141 may be made of copper.

Figure 8:
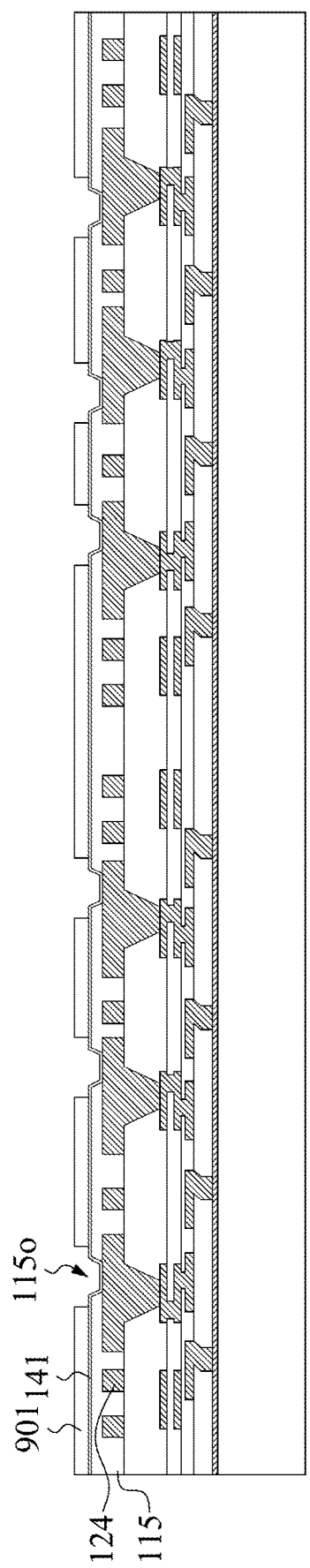

As shown in FIG. 8, a photoresist 901 is formed on or above the top surface of the first dielectric layer 115 (on the seed layer 141). The photoresist 901 exposes the seed layer 141 in the openings 115o (the parts of the seed layer 141 is disposed on the first circuit layer 124 and the sidewalls of the first openings 115o) and the seed layer 141 adjacent to the first openings 115o (the parts of the seed layer 141 is disposed on the top surface of the first dielectric layer 115).

Figure 9:
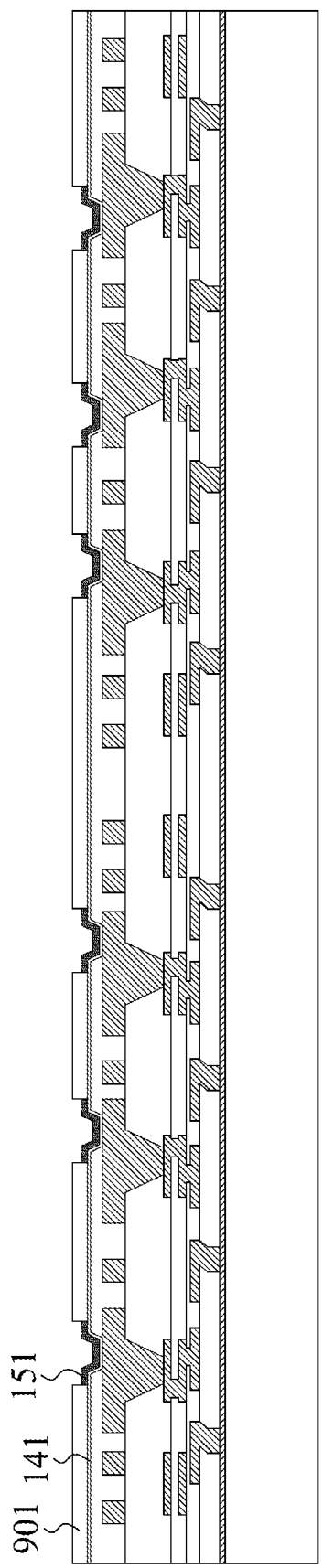

As shown in FIG. 9, a plurality of first bonding pads 151 are formed on the exposed parts of the seed layer 141. The first bonding pads 151 are made of copper. In some embodiments, first, copper alloy layers are formed on the exposed parts of the seed layer 141. Then, the non-copper elements in the copper alloy layers are removed by the acid leaching process. Therefore, the first bonding layers 151 are formed.

Figure 10:
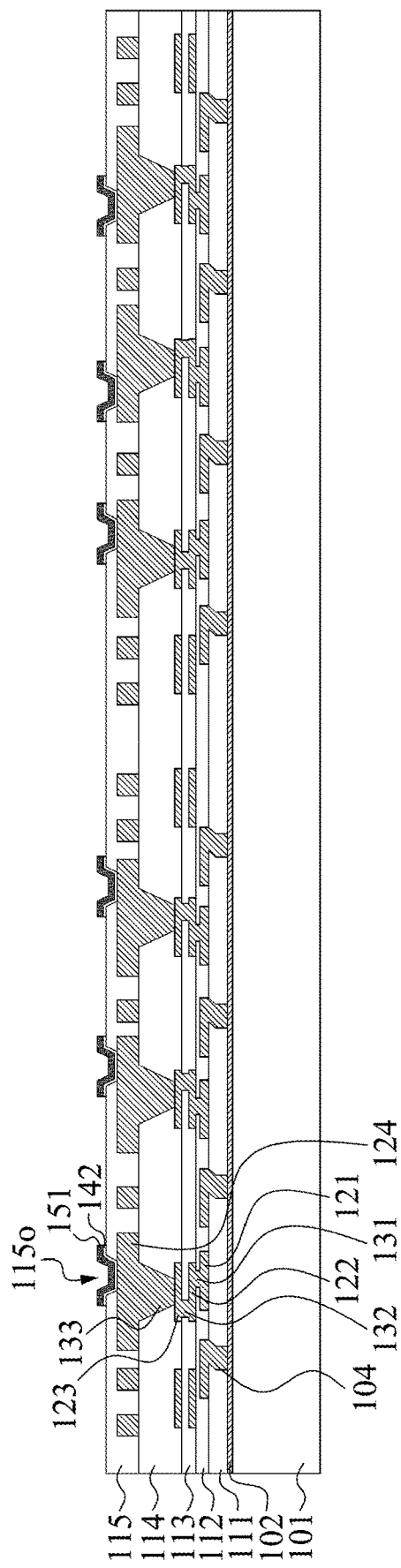

As shown in FIG. 9 and FIG. 10, the photoresist 901 is removed, and the parts of the seed layer 141 which are not covered by the bonding layers 151 are removed. Therefore, a first patterned seed layer 142 is formed.

After carrying out the steps of above FIG. 2 to FIG. 10, a first circuit board 100 is formed. In short, the first circuit board 100 includes a first circuit layer 124, a first dielectric layer 115, a first patterned seed layer 142, and a plurality of first bonding pads 151. The first dielectric layer 115 is disposed on the first circuit layer 124 and has a plurality of first openings 115o exposing a portion of first circuit layer 124. Specifically, the first dielectric layer 115 is formed on dielectric layer 114 and the first circuit layer 124. The first patterned seed layer 142 is disposed on a surface of the first circuit layer 124 exposed through the first openings 115o and sidewalls of the first openings 115o of the first dielectric layer 115, and each first bonding pad 151 is disposed on the first patterned seed layer 142.

Figure 11:
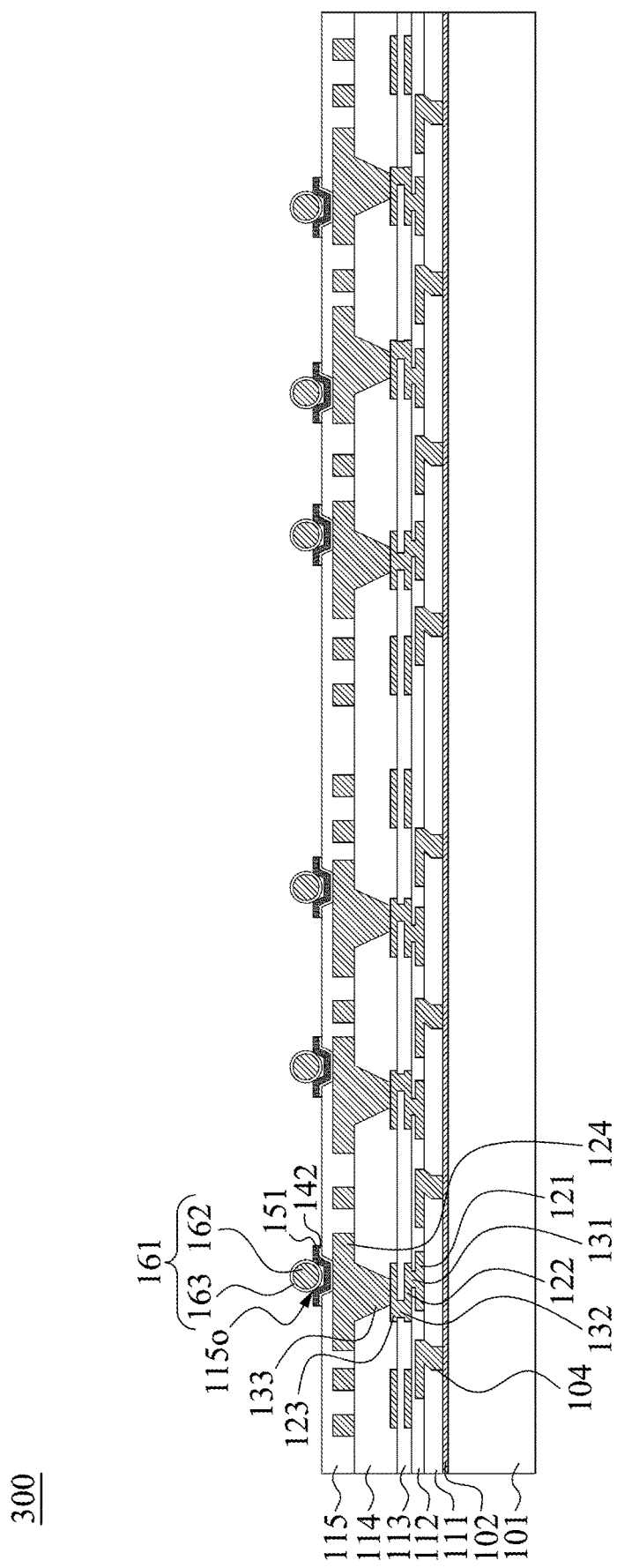

Referring back to FIG. 1, at operation 14, a core-shell particle is disposed on each first bonding pad in which each core-shell particle includes a metallic core and an insulating protective layer cladded the metallic core. FIG. 11 illustrates cross-sectional view of implementing operation 14 in accordance with one embodiment of the present disclosure. As shown in FIG. 11, a core-shell particle 161 is disposed on each first bonding pad 151. In some embodiments, each core-shell particle 161 includes a metallic core 162 and an insulating protective layer 163 cladded the metallic core 162. In some examples, the metallic core 162 is made of copper. In other some examples, the insulating cladding layers 163 includes an insulating polymer material, for example, non-conductive paste (NCP), non-conductive film (NCF), or silane, or insulated nano bonding materials, but not limiting. In one example, each metallic core 162 is substantially a sphere, and each insulating cladding layer 163 is uniformly coated on each metallic core 162.

Figure 12:
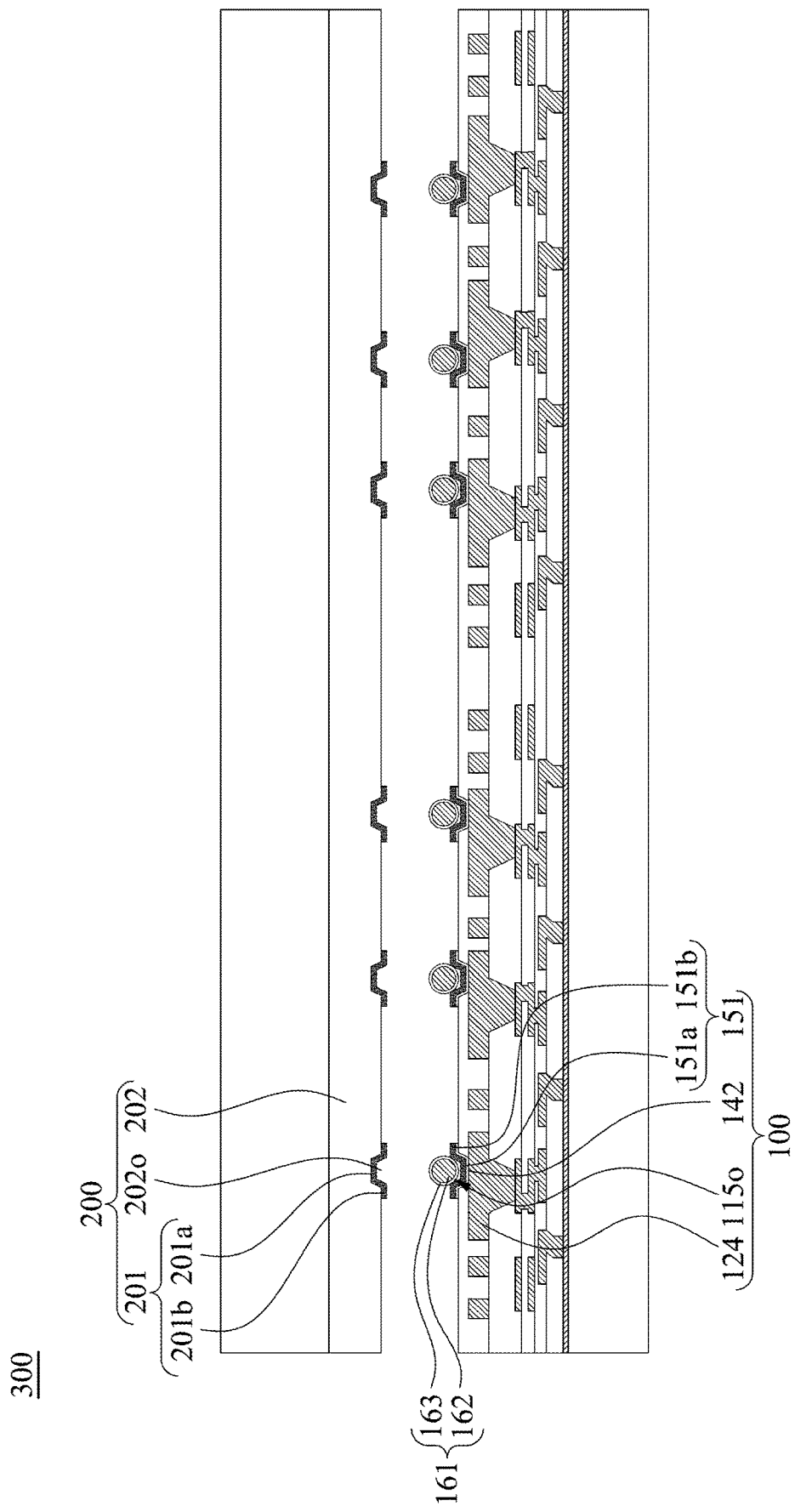
Figure 13:
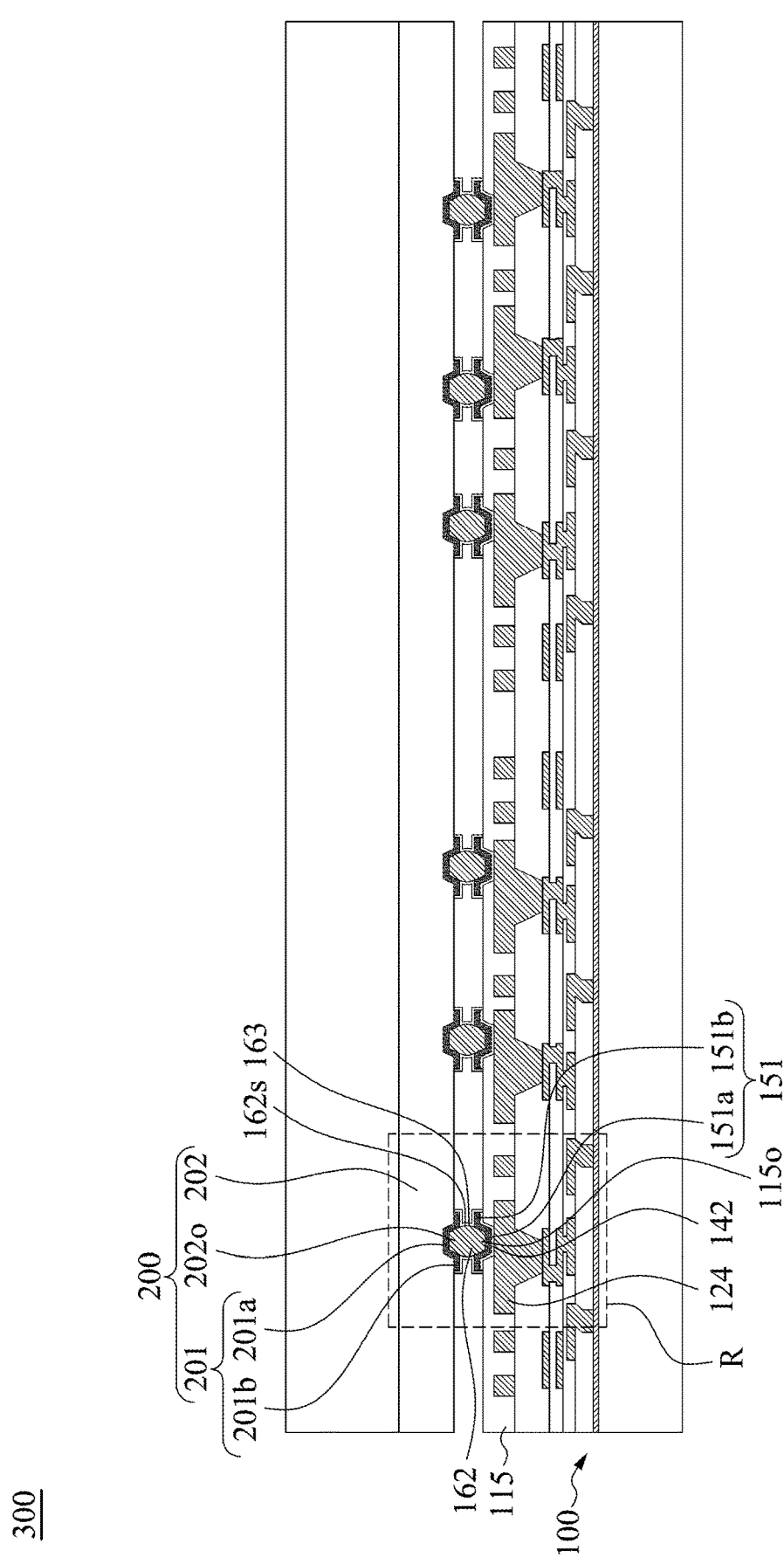
Figure 14:
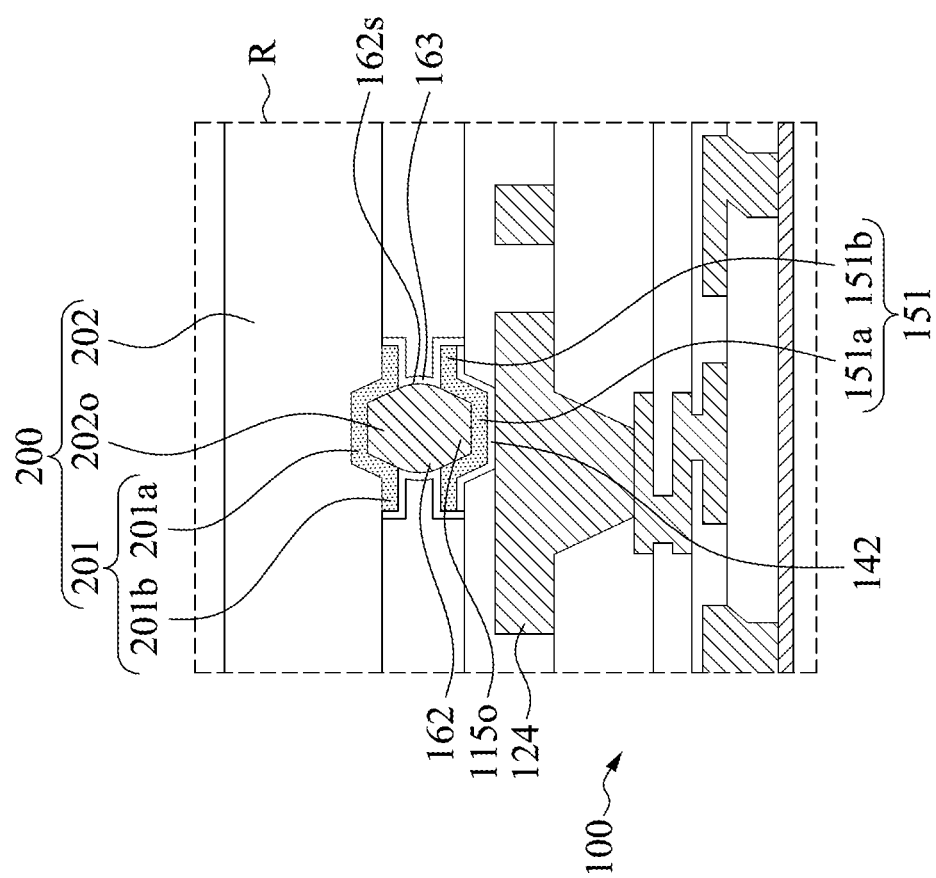
FIG. 14 illustrates an enlarged view of area R in FIG. 13.

At operation 16, a plurality of second bonding pads of an electronic component are bonded to the core-shell particles on the first bonding pads using a thermo-compression such that the metallic cores are being physically connected to the first bonding pads and the second bonding pads. FIG. 12 and FIG. 13 illustrate cross-sectional views of implementing operation 16 at different fabrication stages in accordance with one embodiment of the present disclosure. FIG. 14 illustrates an enlarged view of the area R in FIG. 13. As shown in FIG. 12, a plurality of second bonding pads 201 of an electronic component 200 are bonded to the core-shell particles 161 of the first bonding pads 151 using a thermo-compression such that the metallic cores 162 are physically connected to the second bonding pads 201 and the first bonding pads 151. In various embodiments, the electronic component 200 includes a second dielectric layer 202 having a plurality of second openings 202o. In other words, the second bonding pads 201 are formed on the second openings 202o of the second dielectric layer 202. For example, each second bonding pad 201 includes a first portion 201a located in each second opening 202o and a second portion 201b extending from the first portion 201a to a position above the second dielectric layer 202. In some embodiments, each second bonding pad 201 disposes on bottom surface of each second opening 202o and side wall of each second opening 202o. Similarly, the first bonding pads 151 of above the first circuit board 100 are formed over the first openings 115o of the first dielectric layer 115. For example, each first bonding pad 151 includes a first portion 151a located in each first opening 115o and a second portion 151b extending from the first portion 151a to a position above the first dielectric layer 115. In some embodiments, each first bonding pad 151 disposes on bottom surface of each first opening 115o and side wall of each first opening 115o. In one example, the first bonding pads 151 and the second bonding pads 201 may be made of copper. In another example, the first bonding pads 151 are made of porous copper. In one example, biggest width of each second opening 202o is less than or equal to biggest width of each metallic core 162. Similarly, biggest width of each first opening 115o of above the first circuit board 100 is less than biggest width of each metallic core 162. In one example, the first patterned seed layer 142 and the first bonding pads 151 are made of copper.

Next, as shown in FIG. 13 and FIG. 14, in the process of bonding using a thermo-compression, the insulating protective layers 163 are heated to melt, and the melted insulating protective layers 163 are flowed toward two sides under squeezing action between the first bonding pads 151 and the second bonding pads 201 to cover the first bonding pads 151 and/or the second bonding pads 201. Specifically, the insulating cladding layers 163 flow and cover the second portions 151b of first bonding pads 151 and/or the second portions 201b of the second bonding pads 201. The metallic cores 162 generate deformation under heat and pressure to fill up a remaining space of each first opening 115o and that of each second opening 202o.

As shown in FIG. 13 and FIG. 14, the metallic cores 162 are physically connected to the first bonding pads 151 and the second bonding pads 201 to form an electrical connection between the first circuit board 100 and the electronic component 200 after bonding. The electronic component 200 may be, for example, a second circuit board, a semiconductor chip, or a chip package.

In summary, the electrical connection structure is formed by use of the metallic cores to bond the circuit board to the electronic component using the thermo-compression in the embodiments of the present disclosure. Specifically, because surfaces of the metallic cores are covered by the insulating cladding layers, surfaces of the metallic cores will not cause the problem about oxidation while bonding, and the remaining space between upper connection point and lower connection point (for example, the first bonding pads 151 and the second bonding pads 201) is filled with each metallic core effectively. In addition, when bonding using the thermo-compression, the insulating cladding layers may laterally flow to cover outer side surface of the electrical connection structure to achieve the function of protecting connection point and improve reliability of component assembly.

One aspect of the present invention is provided a stacked structure 300. As shown in FIG. 13, the stacked structure 300 includes a first circuit board 100, an electronic component 200, a plurality of metallic cores 162, and a plurality of insulating cladding layers 163.

In some embodiments, the first circuit board 100 includes a first dielectric layer 115, a first circuit layer 124, a first patterned seed layer 142, and a plurality of first bonding pads 151. In various embodiments, the first circuit layer 124 is disposed in the first dielectric layer 115. In some embodiments, the first circuit layer 124 is made of copper. In one example, the first circuit layer 124 is a conductive path having a specific pattern.

In some embodiments, the first dielectric layer 115 is disposed on the first circuit layer 124. The first dielectric layer 115 has a plurality of first openings 115o exposing a portion of the first circuit layer 124. In one example, biggest width of each first opening 115o is less than biggest width of each metallic core 162.

In some embodiments, the first patterned seed layer 142 is disposed on a surface of the first circuit layer 124 exposed through the first openings 115o and sidewalls of the first openings 115o of the first dielectric layer 115. In some embodiments, each first bonding pad 151 includes a first portion 151a located in each first opening 115o and a second portion 151b extending from the first portion 151a to a position above the first dielectric layer 115. In one example, biggest width of each second opening 202o is less than biggest width of each metallic core 162. In one example, the first patterned seed layer 142 and the first bonding pads 151 are made of copper. In another example, the first bonding pads 151 are made of porous copper.

In some embodiments, the electronic component 200 includes a plurality of second bonding pads 201 opposite to the first bonding pads 151 and a second dielectric layer 202 having a plurality of second openings 202o. For example, each second bonding pad 201 includes a first portion 201a a position in each second opening 202o and a second portion 201b extending from the first portion 201a to a position above the second dielectric layer 202. In one example, biggest width of each second opening 202o is less than biggest width of each metallic core 162. In one example, the second bonding pads 201 are made of copper.

In some embodiments, each metallic core 162 is physically connected to corresponding one of the first bonding pads 151 and a corresponding one of the second bonding pads 201. The first patterned seed layer 142 and the first bonding pads 151 partially fill the first openings 115o such that each first opening 115o exists a remaining space, and each metallic core 162 fully fills each remaining space. Each metallic core 162 has a curved surface 162s. Each curved surface 162s is, for example, convex surface, and sandwiched between the corresponding first bonding pad 151 and the corresponding second bonding pad 201. More specifically, each curved surface 162s continuously extends from each second portion 151b of first bonding pads 151 to each second portion 201b of the second bonding pads 201.

In some embodiments, the insulating cladding layers 163 are separated from each other and covering the curved surfaces 162s of the metallic cores 162. In one example, the first bonding pads 151 and/or the second bonding pads 201 are further covered by the insulating protective layers 163. For example, the second portions 151b of the first bonding pads 151 and the second portions 201b of the second bonding pads 201 are further covered by the insulating cladding layers 163. In one example, the insulating cladding layers 163 include an insulating polymer material or an insulating nano bonding material, such as non-conductive paste (NCP), non-conductive film (NCF), or silane, but not limiting.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A stacked structure, comprising: a first circuit board, comprising: a plurality of first bonding pads; an electronic component comprising a plurality of second bonding pads opposite to the first bonding pads; a plurality of metallic cores, each metallic core being physically connected to a corresponding one of the first bonding pads and a corresponding one of the second bonding pads, wherein each metallic core has a curved surface sandwiched between the corresponding first bonding pad and the corresponding second bonding pad; and a plurality of insulating cladding layers separated from each other and covering the curved surfaces of the metallic cores, the first bonding pads and the second bonding pads.

2. The stacked structure of claim 1, wherein the insulating cladding layers comprise an insulating polymer material or an insulating nano bonding material.

3. The stacked structure of claim 1, wherein the first circuit board further comprises a first circuit layer, a first dielectric layer disposed on the first circuit layer, and a first patterned seed layer, wherein the first dielectric layer has a plurality of first openings exposing a portion of the first circuit layer, and the first patterned seed layer is disposed on a surface of the first circuit layer exposed through the first openings and sidewalls of the first openings of the first dielectric layer.

4. The stacked structure of claim 3, wherein the first patterned seed layer and the first bonding pads partially fill the first openings such that each first opening exists a remaining space, and each metallic core fully fills each remaining space.

5. The stacked structure of claim 3, wherein each first bonding pad comprises a first portion located in each first opening and a second portion extending from the first portion to a position above the first dielectric layer.

6. The stacked structure of claim 5, wherein the second portions of the first bonding pads are covered by the insulating cladding layers.

7. The stacked structure of claim 5, wherein the electronic component further comprises a second dielectric layer having a plurality of second openings, and each second bonding pad comprises a first portion located in each second opening and a second portion extending from the first portion to a position above the second dielectric layer.

8. The stacked structure of claim 7, wherein the second portions of the second bonding pads are cover by the insulating cladding layers.

9. The stacked structure of claim 7, wherein each curved surface continuously extends from each second portion of each first bonding pad to each second portion of each second bonding pad.

10. The stacked structure of claim 1, wherein the first bonding pads are made of porous copper.

11. A method for manufacturing a stacked structure, comprising steps of: providing a first circuit board comprising a plurality of first bonding pads; disposing a core-shell particle on each first bonding pad, wherein each core-shell particle comprises a metallic core and an insulating protective layer covering the metallic core; and bonding a plurality of second bonding pads of an electronic component to the core-shell particles on the first bonding pads using a thermo-compression process such that the metallic cores are physically connected to the second bonding pads and the first bonding pads, wherein the step of bonding the second bonding pads of the electronic component to the core-shell particles of the first bonding pads using the thermo-compression process comprises flowing the insulating protective layers to cover the first bonding pads and the second bonding pads.

12. The method for manufacturing a stacked structure of claim 11, wherein the first bonding pads are made of porous copper.

* * * * *